(12) United States Patent
Law et al.

(10) Patent No.: US 8,022,558 B2
(45) Date of Patent: Sep. 20, 2011

(54) SEMICONDUCTOR PACKAGE WITH RIBBON WITH METAL LAYERS

(75) Inventors: Chee Soon Law, Melaka (MY); Fong Lim, Melaka (MY); Zakaria Abdullah, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 218 days.

(21) Appl. No.: 12/371,066

(22) Filed: Feb. 13, 2009

(65) Prior Publication Data

US 2010/0207279 A1 Aug. 19, 2010

(51) Int. Cl.
*H01L 23/48* (2006.01)
*H01L 23/495* (2006.01)

(52) U.S. Cl. ........ 257/781; 257/784; 257/777; 257/666; 257/E23.031

(58) Field of Classification Search .................. 257/784, 257/777, 781, 666, E23.031
See application file for complete search history.

(56) References Cited

U.S. PATENT DOCUMENTS

| 5,147,815 | A | * | 9/1992 | Casto | 29/827 |
|---|---|---|---|---|---|
| 5,252,857 | A | * | 10/1993 | Kane et al. | 257/686 |
| 5,438,224 | A | * | 8/1995 | Papageorge et al. | 257/777 |
| 5,471,369 | A | * | 11/1995 | Honda et al. | 361/813 |
| 5,677,567 | A | * | 10/1997 | Ma et al. | 257/666 |
| 6,040,626 | A | * | 3/2000 | Cheah et al. | 257/735 |
| 6,501,043 | B1 | * | 12/2002 | Ruben | 219/121.64 |
| 2004/0217488 | A1 | * | 11/2004 | Luechinger | 257/784 |
| 2005/0269694 | A1 | | 12/2005 | Luechinger | |
| 2007/0221706 | A1 | | 9/2007 | Calliham | |
| 2007/0222087 | A1 | * | 9/2007 | Lee et al. | 257/784 |
| 2007/0224805 | A1 | | 9/2007 | Oota | |
| 2008/0057799 | A1 | | 3/2008 | Pereira | |

FOREIGN PATENT DOCUMENTS

DE 10 2006 060 899 7/2008

* cited by examiner

*Primary Examiner* — Nitin Parekh
(74) *Attorney, Agent, or Firm* — Dicke, Billig & Czaja, PLLC (57) ABSTRACT

A semiconductor package includes a first semiconductor chip, a second semiconductor chip and a ribbon. The ribbon includes a first metal layer and a second metal layer. The first metal layer is welded to the first chip and the second metal layer is attached to the second chip.

15 Claims, 9 Drawing Sheets

SEMICONDUCTOR PACKAGE WITH RIBBON WITH METAL LAYERS

FIELD OF THE INVENTION

The present invention generally relates to a semiconductor package, and more particularly to a semiconductor package that includes multiple semiconductor chips and a ribbon.

BACKGROUND OF THE INVENTION

Semiconductor chips include bond pads that are electrically connected to external circuitry in order to function as part of an electronic system. The external circuitry is typically a lead array such as lead frame or a support substrate such as a printed circuit board. Electrical connection between the chip and the external circuitry is often achieved by wire bonding, tape automated bonding (TAB) or flip-chip bonding. For instance, with flip-chip bonding, ball grid array (BGA) packages contain an array of solder balls to mount on corresponding terminals on a printed circuit board, and land grid array (LGA) packages contain an array of metal pads that receive corresponding solder traces mounted on corresponding terminals on a printed circuit board.

Semiconductor packages may include multiple chips that are stacked to provide a compact high-density structure. The upper chip is often flip-chip bonded to the lower chip or interconnect metallization using solder balls. Semiconductor packages may also include a flexible conductive ribbon with an aluminum layer that is welded to the chip and the lead using wedge bonding. The aluminum layer provides high current capability, low spreading resistance and reliable bonds. However, the aluminum layer does not provide a suitable interconnection for a stacked upper chip since the wedge bond has rough, uneven top surface with sharp peaks and valleys that does not accommodate solder reflow. As a result, the upper chip would be attached to the ribbon using a solder ball that makes a poor reliability bond with the aluminum layer.

Therefore, there is a need for a semiconductor package that includes multiple chips attached to a ribbon in a reliable and cost-effective manner.

SUMMARY

The present invention provides a semiconductor package that includes a first semiconductor chip, a second semiconductor chip and a ribbon. The ribbon includes a first metal layer and a second metal layer. The first metal layer is welded to the first chip and the second metal layer is attached to the second chip.

The present invention also provides a method of manufacturing a semiconductor package that includes providing a first semiconductor chip, providing a second semiconductor chip, providing a ribbon that includes a first metal layer and a second metal layer, then welding the first metal layer to the first chip, and attaching the second metal layer to the second chip.

These and other features and advantages of the present invention will become more apparent in view of the detailed description that follows.

BRIEF DESCRIPTION OF THE DRAWINGS

Embodiments of the present invention will now be more fully described, with reference to the drawings in which.

DETAILED DESCRIPTION OF THE INVENTION

In the following description, embodiments of the present invention are described. It shall be apparent to those skilled in the art, however, that the present invention may be practiced without such details. Some of the details are not be described at length so as not to obscure the present invention.

Figure 1:
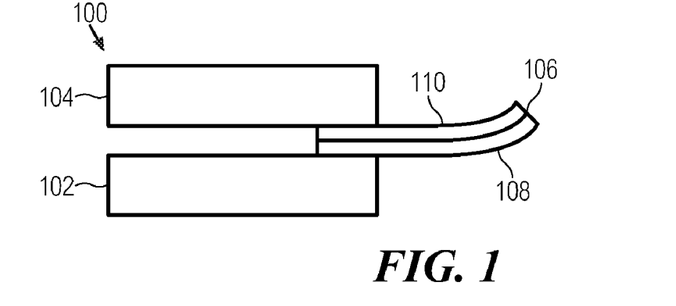
FIG. 1 is a cross-sectional view of a semiconductor package in accordance with a first embodiment.

FIG. 1 is a cross-sectional view of semiconductor package 100 in accordance with a first embodiment. Semiconductor package 100 includes first semiconductor chip 102, second semiconductor chip 104 and ribbon 106. Ribbon 106 includes first metal layer 108 and second metal layer 110. First metal layer 108 is welded to first chip 102 and second metal layer 110 is attached to second chip 104.

Figure 2A:
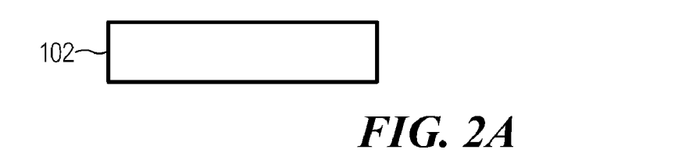
FIGS. 2A-2C are cross-sectional views of a method of making the semiconductor package of FIG. 1.
Figure 2B:
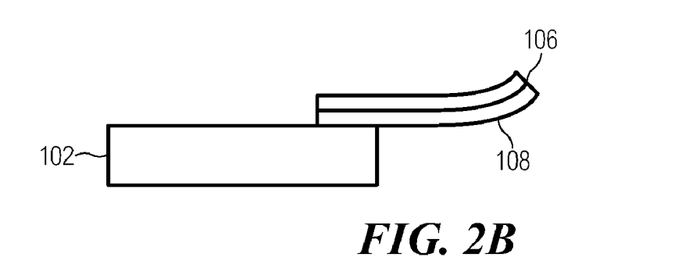
Figure 2C:
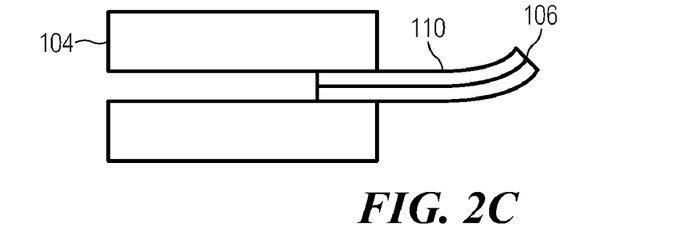

FIGS. 2A-2C are cross-sectional views of a method of making semiconductor package 100. In FIG. 2A, first chip 102 is provided. In FIG. 2B, ribbon 106 is welded at first metal layer 108 to first chip 102. In FIG. 2C, ribbon 106 is attached at second metal layer 110 to second chip 104.

Figure 3:
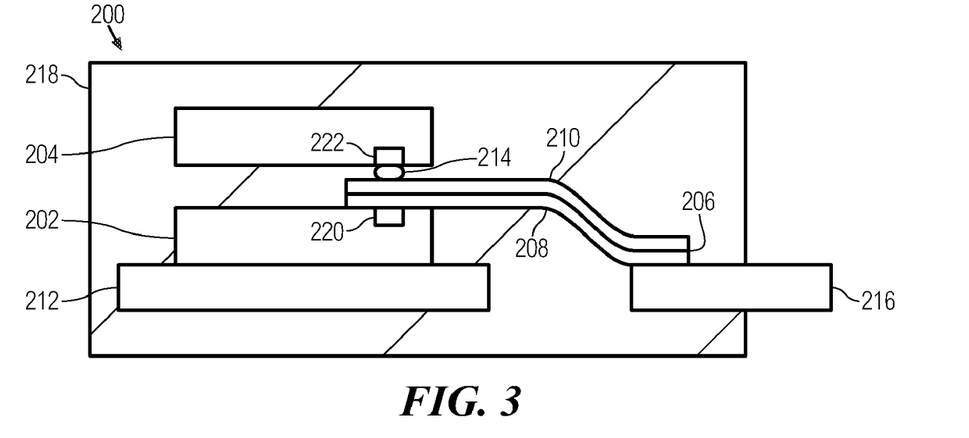
FIG. 3 is a cross-sectional view of a semiconductor package in accordance with a second embodiment.

FIG. 3 is a cross-sectional view of semiconductor package 200 in accordance with a second embodiment. Semiconductor package 200 includes first chip 202, second chip 204, ribbon 206, die pad 212, electrical connector 214, lead 216 and encapsulant 218. First chip 202 includes first bond pad 220, second chip 204 includes second bond pad 222, and ribbon 206 includes first metal layer 208 and second metal layer 210.

First chip 202 is a lower chip mounted on die pad 212 by a thin adhesive (not shown), second chip 204 is an upper chip inverted and stacked on first chip 202, and second bond pad 222 overlaps and is vertically aligned with first bond pad 220.

Ribbon 206 is a flexible conductive aluminum clad copper ribbon with high current capability and low spreading resistance. First metal layer 208 is an aluminum layer with a thickness of 2 mm, and second metal layer 210 is a copper layer with a thickness of 0.7 mm. First metal layer 208 and second metal layer 210 are clad bonded together by high-pressure rolling of a copper foil onto an aluminum strip and annealing the composite to form a sold-solution weld.

First metal layer 208 is welded to first bond pad 220 by a wedge bond and welded to lead 214 by another wedge bond, and second metal layer 210 is attached to second bond pad 222 by electrical connector 214.

The wedge bond at first bond pad 220 is formed under substantial compressive force and vibration using ultrasonic bonding. The wedge bond would create a rough, uneven top surface with sharp peaks and valleys if the aluminum layer provided the top surface (i.e., in the absence of the copper layer) since the wedge bonding tool would contact the aluminum layer. This rough, uneven top surface would create a poor interface for solder reflow. In particular, most or all of the solder would fill the valleys, and the remaining solder (if any) over the peaks would be thin, brittle and prone to cracking. Advantageously, since the copper layer overlays the aluminum layer, the wedge bonding tool contacts the copper layer rather than the aluminum layer, and the copper layer absorbs stress and retains a relatively flat, even top surface due to its robust metallurgical properties.

Electrical connector 214 is a solder ball that contacts and is sandwiched between second chip 204 and ribbon 206. First metal layer 208 contacts and is sandwiched between and electrically connects second metal layer 210 and first bond pad 220, is spaced from second chip 204 and electrical connector 214 and overlaps first bond pad 220. Second metal layer 210 contacts and is sandwiched between and electrically connects first metal layer 208 and electrical connector 214, is spaced from chips 202 and 204 and overlaps first metal layer 208 and first bond pad 220. Electrical connector 214 contacts and is sandwiched between and electrically connects second metal layer 210 and second bond pad 222, is spaced from first chip 202 and first metal layer 208 and overlaps metal layers 208 and 210 and first bond pad 220.

Bond pads 220 and 222 are electrically connected to one another by an electrically conductive path that consists of and requires metal layers 208 and 210 and electrical connector 214. Furthermore, first bond pad 220 is electrically connected to lead 216 by an electrically conductive path provided by metal layers 208 and 210, and second bond pad 222 is electrically connected to lead 216 by an electrically conductive path provided by metal layers 208 and 210 and electrical connector 214.

Lead 216 is spaced from chips 202 and 204, protrudes from encapsulant 218 and provides electrical conduction of current between bond pads 220 and 222 and external circuitry during operation of chips 202 and 204.

Encapsulant 218 is electrically insulative and thermally conductive molded plastic that contacts and protects chips 202 and 204, ribbon 206, die pad 212 and electrical connector 214.

First metal layer 208 and second metal layer 210 can be various conductive metals that interface well with first chip 202 and electrical connector 214, respectively. Likewise, electrical connector 214 can be various conductive materials such as solder, solder wire and conductive glue that interface well with second chip 204 and second metal layer 210. In addition, a thin gold layer can be flash plated on second metal layer 210 to improve solder wettability, for instance where second metal layer 210 is copper and electrical connector 214 is solder, in which case the solder joint would absorb the intervening gold during the solder reflow operation and contact the copper layer.

Figure 4A:
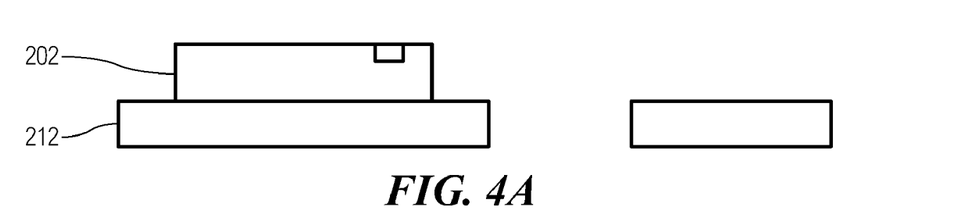
FIGS. 4A-4E are cross-sectional views of a method of making the semiconductor package of FIG. 3.
Figure 4B:
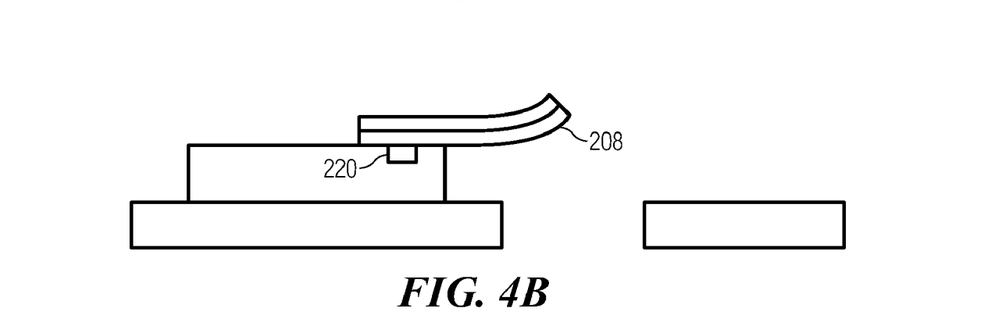
Figure 4C:
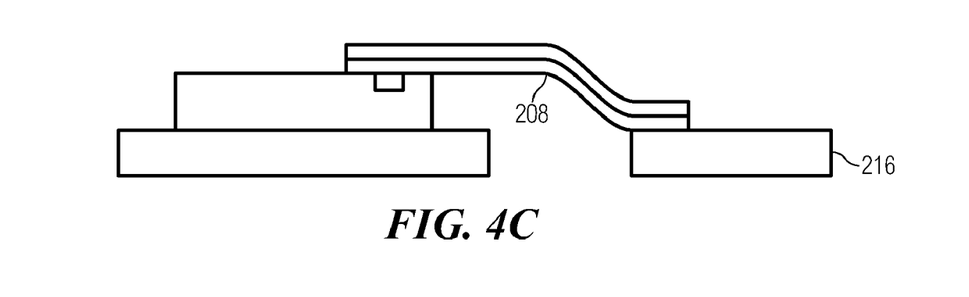
Figure 4D:
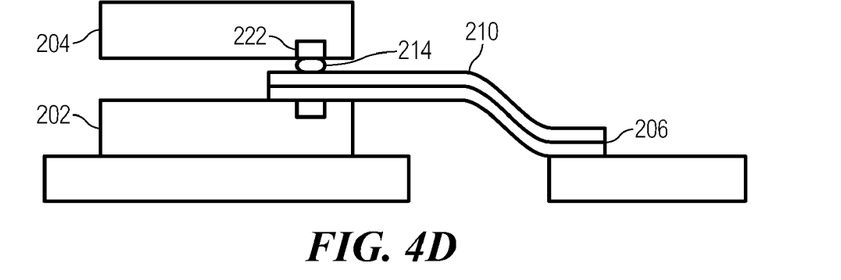
Figure 4E:
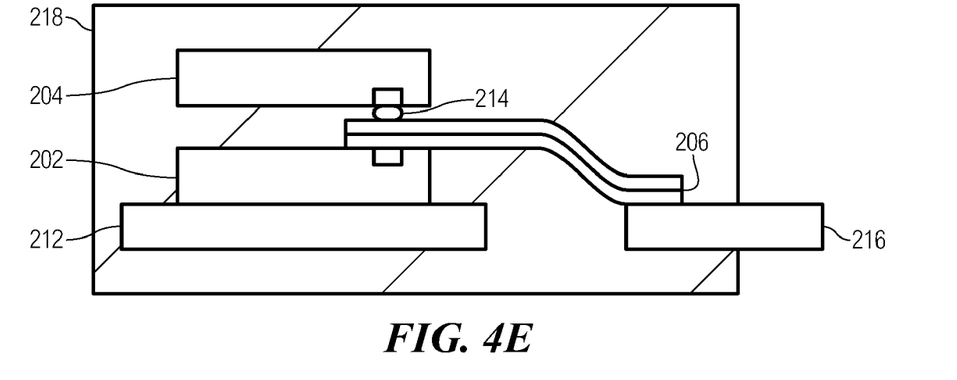

FIGS. 4A-4E are cross-sectional views of a method of making semiconductor package 200. In FIG. 4A, first chip 202 is mounted on die pad 212. In FIG. 4B, first metal layer 208 is wedge bonded to first bond pad 220 using ultrasonic bonding. In FIG. 4C, first metal layer 208 is wedge bonded to lead 216 using ultrasonic bonding. In FIG. 4D, second metal layer 210 is soldered to second bond pad 222 by electrical connector 214, thereby mechanically attaching and electrically connecting second chip 204 to ribbon 206, and mounting second chip 204 on ribbon 206 such that second chip 204 is stacked on first chip 202. Initially a solder bump is attached to second bond pad 222. Thereafter, second chip 204 is inverted and placed on ribbon 206 such that the solder bump contacts and is sandwiched between second metal layer 210 and second bond pad 222. The solder bump is then heated, reflowed and hardened during a solder reflow operation to provide electrical connector 214 as a solder ball that contacts and is sandwiched between second metal layer 210 and second bond pad 222. In FIG. 4E, encapsulant 218 is formed on chips 202 and 204, ribbon 206, die pad 212, electrical connector 214 and lead 216 by transfer molding.

Figures 5, 6A:
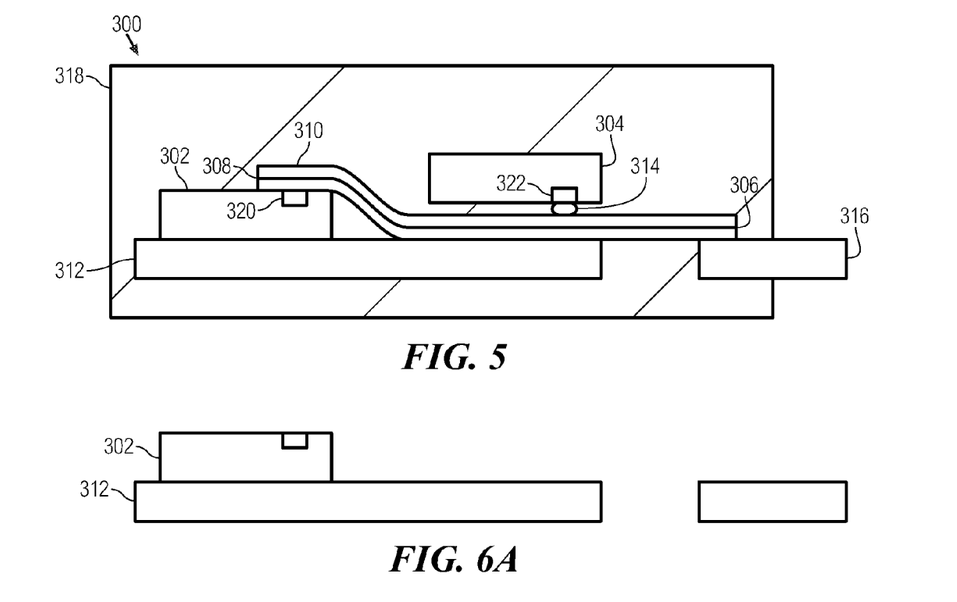
FIG. 5 is a cross-sectional view of a semiconductor package in accordance with a third embodiment.
FIGS. 6A-6E are cross-sectional views of a method of making the semiconductor package of FIG. 5.

FIG. 5 is a cross-sectional view of semiconductor package 300 in accordance with a third embodiment. Semiconductor package 300 includes first chip 302, second chip 304, ribbon 306, die pad 312, electrical connector 314, lead 316 and encapsulant 318. First chip 302 includes first bond pad 320, second chip 304 includes second bond pad 322, and ribbon 306 includes first metal layer 308 and second metal layer 310.

Semiconductor package 300 is generally similar to semiconductor package 200, except that chips 302 and 304 are laterally offset from one another and ribbon 306 is attached to die pad 312.

Figure 6B:
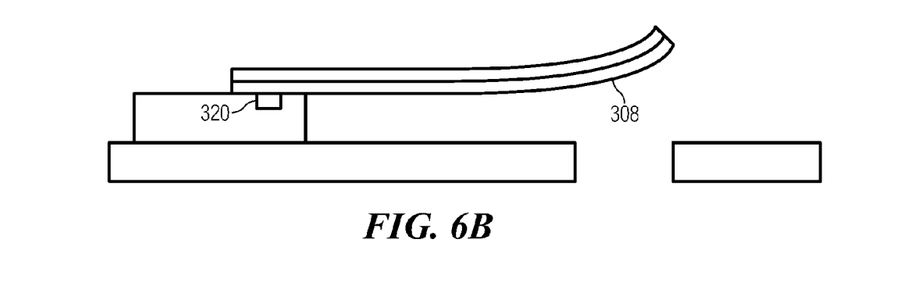
Figure 6C:
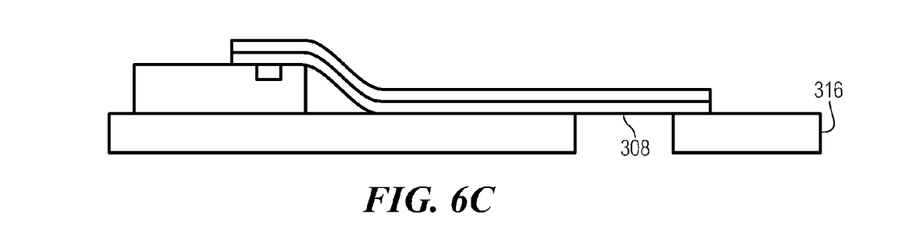
Figure 6D:
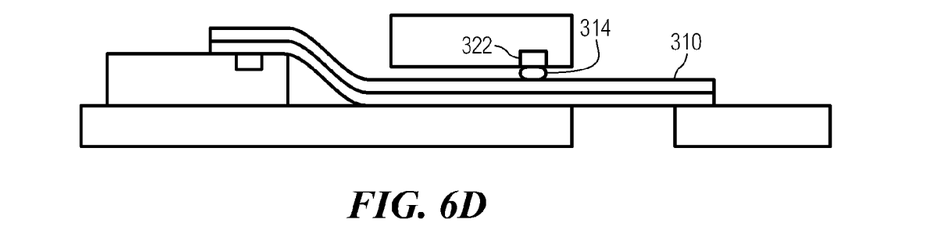
Figure 6E:
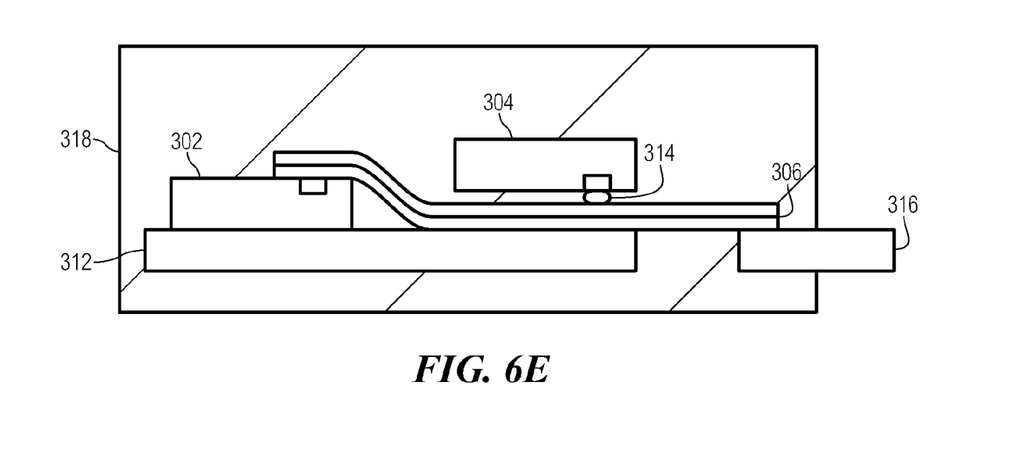

FIGS. 6A-6E are cross-sectional views of a method of making semiconductor package 300. In FIG. 6A, first chip 302 is mounted on die pad 312. In FIG. 6B, first metal layer 308 is wedge bonded to first bond pad 320 using ultrasonic bonding. In FIG. 6C, first metal layer 308 is wedge bonded to die pad 312 and lead 316 using ultrasonic bonding. In FIG. 6D, second metal layer 310 is soldered to second bond pad 322 by electrical connector 314. In FIG. 6E, encapsulant 618 is formed on chips 302 and 304, ribbon 306, die pad 312, electrical connector 314 and lead 316 by transfer molding.

Figure 7:
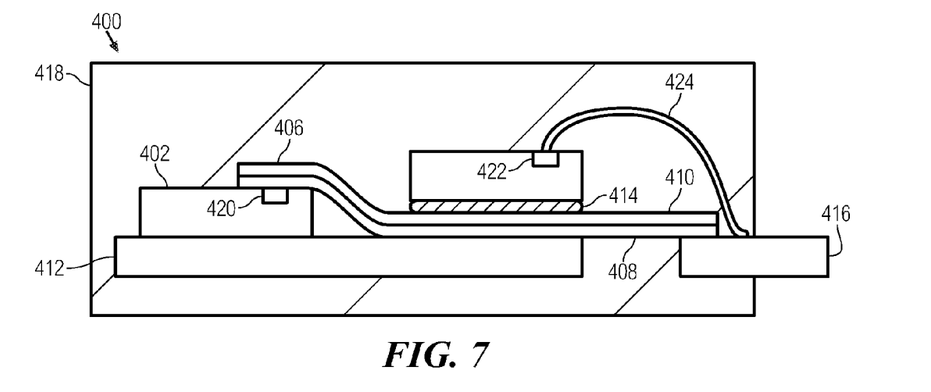
FIG. 7 is a cross-sectional view of a semiconductor package in accordance with a fourth embodiment.

FIG. 7 is a cross-sectional view of semiconductor package 400 in accordance with a fourth embodiment. Semiconductor package 400 includes first chip 402, second chip 404, ribbon 406, die pad 412, electrical connector 414, lead 416, encapsulant 418 and wire bond 424. First chip 402 includes first bond pad 420, second chip 404 includes second bond pad 422, and ribbon 406 includes first metal layer 408 and second metal layer 410.

Semiconductor package 400 is generally similar to semiconductor package 200, except that chips 402 and 404 are laterally offset from one another, second chip 404 is non-inverted, ribbon 406 is attached to die pad 412, electrical connector 414 contacts and is sandwiched between the backside of second chip 404 and second metal layer 410, and second bond pad 422 is electrically connected to lead 416 by wire bond 424.

Figure 8A:
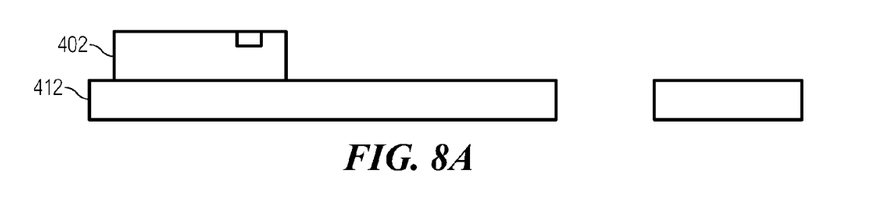
FIGS. 8A-8F are cross-sectional views of a method of making the semiconductor package of FIG. 7.
Figure 8B:
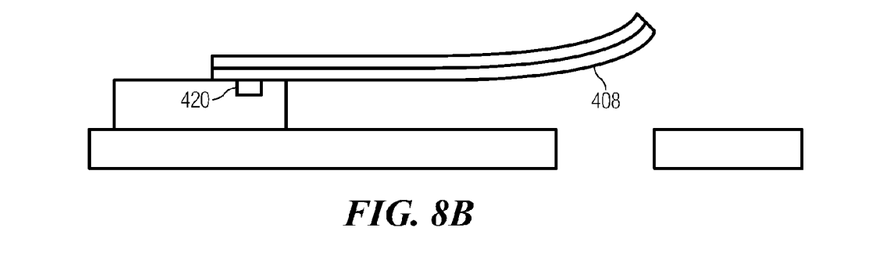
Figure 8C:
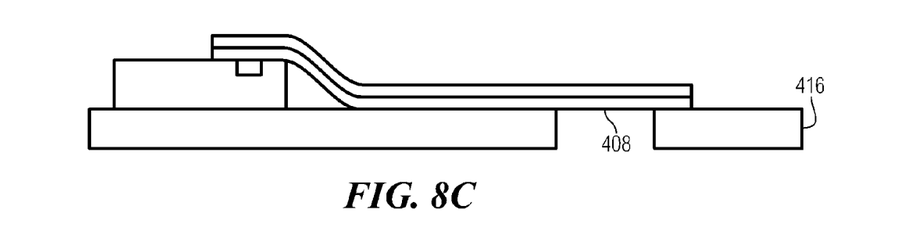
Figure 8D:
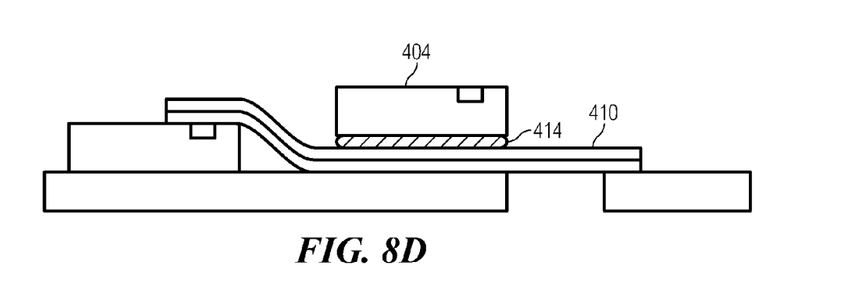
Figure 8E:
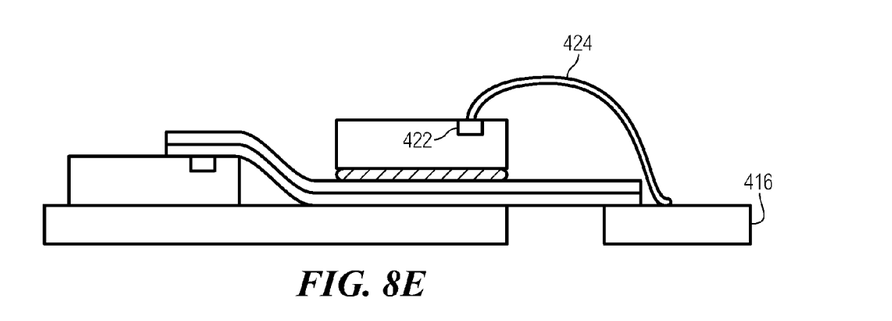
Figure 8F:
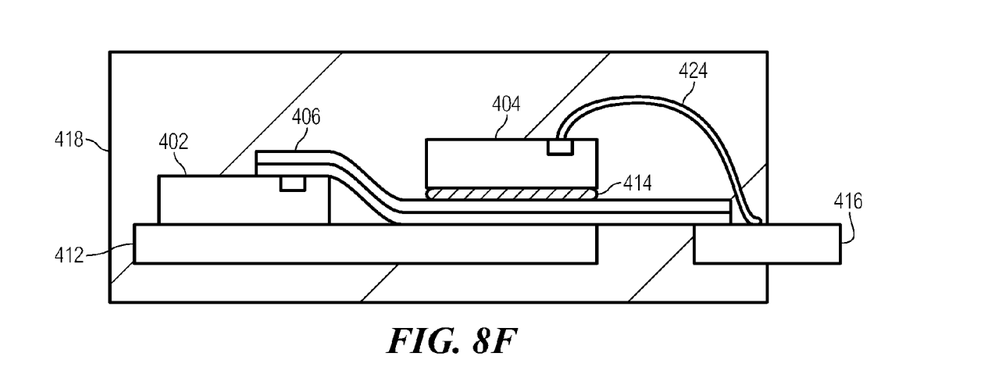

FIGS. 8A-8F are cross-sectional views of a method of making semiconductor package 400. In FIG. 8A, first chip 402 is mounted on die pad 412. In FIG. 8B, first metal layer 408 is wedge bonded to first bond pad 420 using ultrasonic bonding. In FIG. 8C, first metal layer 408 is wedge bonded to die pad 412 and lead 416 using ultrasonic bonding. In FIG. 8D, second metal layer 410 is attached to second chip 404 by electrical connector 414. Initially uncured epoxy is deposited on second metal layer 410. Thereafter, second chip 404 is placed on the uncured epoxy such that the uncured epoxy contacts and is sandwiched between second chip 404 and second metal layer 410. The uncured epoxy is then heated, cured and hardened to provide electrical connector 414 as electrically and thermally conductive glue that contacts and is sandwiched between second chip 404 and second metal layer 410. In FIG. 8E, second bond pad 422 is electrically connected to lead 416 by wire bond 424. In FIG. 8F, encapsulant 418 is formed on chips 402 and 404, ribbon 406, die pad 412, electrical connector 414, lead 416 and wire bond 424 by transfer molding.

Figure 9:
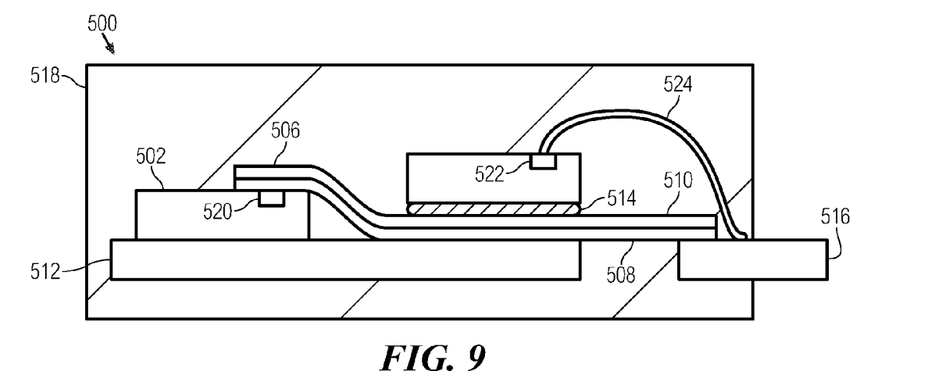
FIG. 9 is a cross-sectional view of a semiconductor package in accordance with a fifth embodiment.

FIG. 9 is a cross-sectional view of semiconductor package 500 in accordance with a fifth embodiment. Semiconductor package 500 includes first chip 502, second chip 504, ribbon 506, die pad 512, thermal connector 514, lead 516, encapsulant 518 and wire bond 524. First chip 502 includes first bond pad 520, second chip 504 includes second bond pad 522, and ribbon 506 includes first metal layer 508 and second metal layer 510.

Semiconductor package 500 is generally similar to semiconductor package 200, except that chips 502 and 504 are laterally offset from one another, second chip 504 is non-inverted, ribbon 506 is attached to die pad 512, thermal connector 514 contacts and is sandwiched between the backside of second chip 504 and second metal layer 510 and is electrically insulative, and second bond pad 522 is electrically connected to lead 516 by wire bond 524.

Figure 10A:
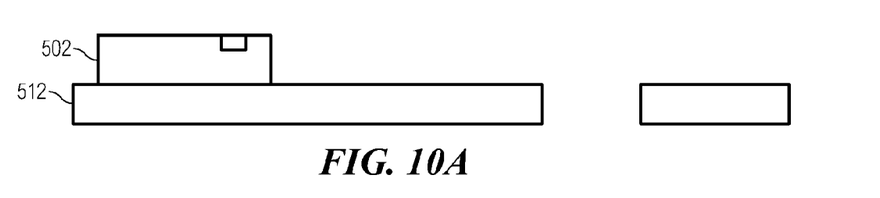
FIGS. 10A-10F are cross-sectional views of a method of making the semiconductor package of FIG. 9.
Figure 10B:
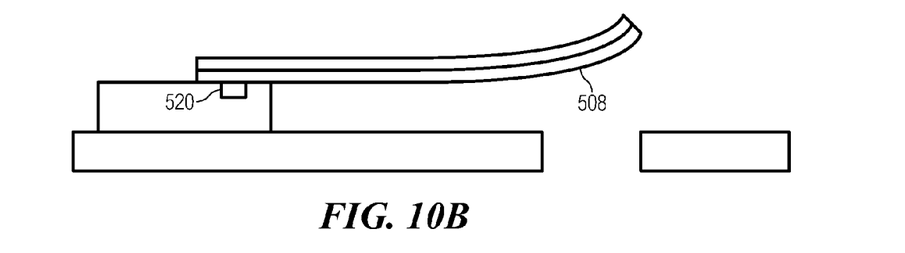
Figure 10C:
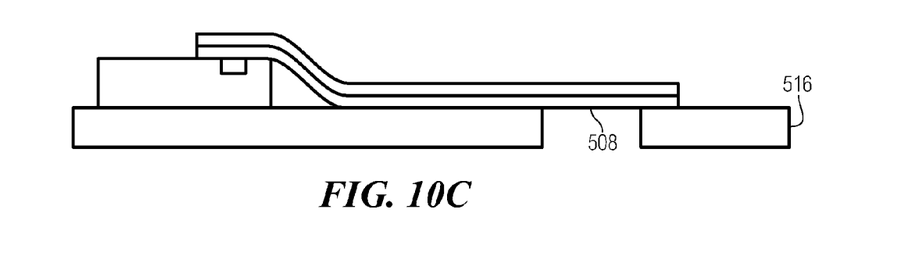
Figure 10D:
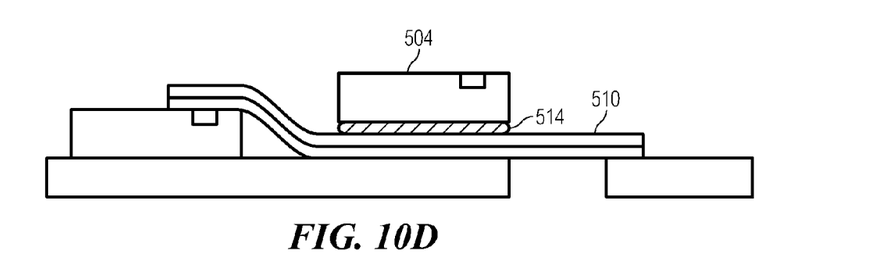
Figure 10E:
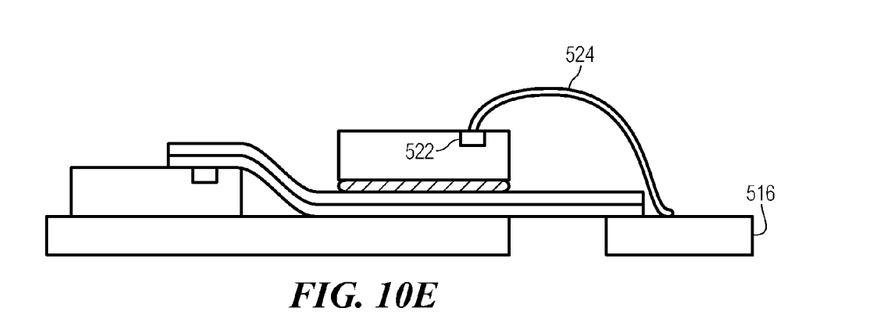
Figure 10F:
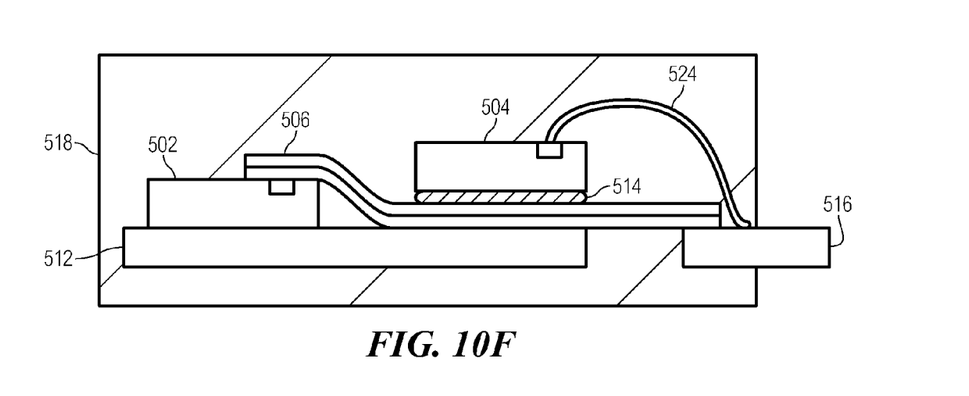

FIGS. 10A-10F are cross-sectional views of a method of making semiconductor package 500. In FIG. 10A, first chip 502 is mounted on die pad 512. In FIG. 10B, first metal layer 508 is wedge bonded to first bond pad 520 using ultrasonic bonding. In FIG. 10C, first metal layer 508 is wedge bonded to die pad 512 and lead 516 using ultrasonic bonding. In FIG. 10D, second metal layer 510 is attached to second chip 504 by thermal connector 514. Initially uncured epoxy is deposited on second metal layer 510. Thereafter, second chip 204 is placed on the uncured epoxy such that the uncured epoxy contacts and is sandwiched between second chip 504 and second metal layer 510. The uncured epoxy is then heated, cured and hardened to provide thermal connector 514 as an electrically insulative and thermally conductive glue that contacts and is sandwiched between second chip 504 and second metal layer 510. In FIG. 10E, second bond pad 522 is electrically connected to lead 516 by wire bond 524. In FIG. 10F, encapsulant 518 is formed on chips 502 and 504, ribbon 506, die pad 512, thermal connector 514, lead 516 and wire bond 524 by transfer molding.

The above description and examples illustrate embodiments of the present invention, and it will be appreciated that various modifications and improvements can be made without departing from the scope of the present invention.

The invention claimed is:

1. A semiconductor package, comprising:
a first semiconductor chip;
a second semiconductor chip; and
a ribbon that includes a first metal layer and a second metal layer, wherein the first metal layer is bonded to the first chip and the second metal layer is attached to the second chip, the second metal layer covering a portion of a surface of the first metal layer opposite the bond to the first chip, the second metal layer absorbing a stress from mechanical contact during the bonding of the first metal layer to the first chip and retaining a surface characteristic thereof for enabling the second metal layer to be attached to the second chip.

2. The semiconductor package of claim 1, wherein the first metal layer is an aluminum layer and the second metal layer is a copper layer.

3. The semiconductor package of claim 2, wherein the copper layer is attached to the second chip by an electrical connector that is solder or glue.

4. The semiconductor package of claim 3, wherein the aluminum layer contacts and is sandwiched between the copper layer and the first chip, the copper layer contacts and is sandwiched between the electrical connector and the aluminum layer, and the electrical connector contacts and is sandwiched between the copper layer and the second chip.

5. The semiconductor package of claim 1, wherein the second chip is stacked on the first chip.

6. A semiconductor package, comprising:
a first semiconductor chip that includes a first bond pad;
a second semiconductor chip that includes a second bond pad;
an electrical connector that is solder or glue; and
a ribbon that includes an aluminum layer and a copper layer, wherein the aluminum layer and the copper layer are bonded together, the aluminum layer contacts and is sandwiched between the copper layer and the first bond pad and is wedge bonded to the first bond pad, the copper layer contacts and is sandwiched between the electrical connector and the aluminum layer and overlaps and is spaced from the first bond pad, the copper layer absorbs a stress from mechanical contact during the wedge bonding and retains a surface characteristic thereof, the electrical connector contacts and is sandwiched between the copper layer and the second bond pad and is spaced from the aluminum layer and the first bond pad, and the second bond pad overlaps and is spaced from the aluminum layer and the copper layer, thereby electrically connecting the bond pads using an electrically conductive path that requires the aluminum layer, the copper layer and the electrical connector.

7. The semiconductor package of claim 6, wherein the aluminum layer is wedge bonded to a lead that is spaced from the chips and provides electrical conduction of current between the bond pads and external circuitry during operation of the chips.

8. The semiconductor package of claim 6, wherein the electrically conductive path consists of the aluminum layer, the copper layer and the electrical connector.

9. The semiconductor package of claim 6, wherein the chips are laterally spaced from one another and the ribbon extends laterally between the chips.

10. The semiconductor package of claim 6, wherein the second chip is stacked on the first chip and the second bond pad overlaps the first bond pad.

11. A semiconductor package, comprising:
a first semiconductor chip that includes a first bond pad;
a second semiconductor chip that includes a second bond pad;
electrical connector means; and
a ribbon means that includes an aluminum layer and a copper layer, wherein the aluminum layer and the copper layer are bonded together, the aluminum layer is wedge bonded to the first bond pad, the copper layer overlaps and is spaced from the first bond pad, the copper layer absorbs a stress from mechanical contact during the wedge bonding and retains a surface characteristic thereof, and the electrical connector means contacts the copper layer and the second bond pad based on the retained surface characteristic of the copper layer and is spaced from the aluminum layer and the first bond pad, thereby electrically connecting the bond pads using electrically conductive path means that includes the aluminum layer, the copper layer and the electrical connector.

12. The semiconductor package of claim 11, wherein the electrical connector means is solder or glue.

13. The semiconductor package of claim 11, wherein the aluminum layer contacts and is sandwiched between the copper layer and the first bond pad, the copper layer contacts and is sandwiched between the electrical connector means and the aluminum layer, and the electrical connector means contacts and is sandwiched between the copper layer and the second bond pad.

14. The semiconductor package of claim 11, wherein the electrically conductive path means consists of the aluminum layer, the copper layer and the electrical connector means.

15. The semiconductor package of claim 11, wherein the second chip is stacked on the first chip and the second bond pad overlaps the first bond pad.

* * * * *